United States Patent [19]

Leslie

[11] 4,344,175
[45] Aug. 10, 1982

[54] MUTING CIRCUIT
[75] Inventor: Samuel A. Leslie, Forest, Va.
[73] Assignee: General Electric Company, Lynchburg, Va.
[21] Appl. No.: 218,855
[22] Filed: Dec. 22, 1980
[51] Int. Cl.³ .......................................... H04M 11/06
[52] U.S. Cl. ...................................... 375/5; 329/107; 375/94; 455/218
[58] Field of Search ............... 179/15 B, 15 W, 1 UC, 179/84 VF, 20 P, 3, 4; 329/104, 107; 328/108, 109, 110; 375/5, 94, 95; 455/212, 218, 222

[56] References Cited

U.S. PATENT DOCUMENTS

| | | | |
|---|---|---|---|
| 3,624,528 | 11/1971 | Adlhock | 329/104 |
| 3,636,257 | 1/1972 | Dixon | 179/3 |
| 3,665,107 | 5/1972 | Kopec et al. | 179/4 |
| 3,909,727 | 9/1975 | Hughes et al. | 179/2 DP |
| 3,927,376 | 12/1975 | Ferrie | 375/5 |
| 3,939,431 | 2/1976 | Cohlman | 375/5 |
| 3,995,225 | 11/1976 | Horn | 329/107 |
| 4,002,982 | 1/1977 | Catania | 375/5 |
| 4,020,421 | 4/1977 | Elder et al. | 375/5 |

Primary Examiner—Benedict V. Safourek
Attorney, Agent, or Firm—James J. Williams

[57] ABSTRACT

A muting circuit detects data transitions during windows generated from received data, and counts the number of such transitions during the windows. A muting signal is produced in response to a predetermined count. If a transition occurs outside a window, the count is reset to zero, and an unmute signal is produced until the predetermined count is reached.

11 Claims, 2 Drawing Figures

MUTING CIRCUIT

BACKGROUND OF THE INVENTION

My invention relates to a muting circuit, and particularly to a muting circuit for preventing data signals from being audibly reproduced by a radio receiver.

In radio communication systems, data signals are frequently transmitted just before voice signals. Such data signals provide identification or other functions, and are desirable or sometimes necessary. However, if the data signals are audibly reproduced by the radio receiver, they are noisy and can be annoying to a person operating or using the receiver, particularly over long periods of time.

Accordingly, a primary object of my invention is to provide a new and improved muting circuit for radio receivers.

Another object of my invention is to provide a new and improved circuit that provides a muting signal in response to received data signals.

Another object of my invention is to provide a new and improved circuit that provides a muting signal in response to data signals having a relatively steady or constant rate.

Another object of my invention is to provide a new and improved circuit that provides a muting signal when a radio receiver receives data signals, and that provides no muting signals when a radio receiver receives relatively random signals such as voice or noise.

Data muting circuits for radio receivers are known in the art, such as exemplified by U.S. Pat. No. 3,939,431. However, such known muting circuits suffer from various disadvantages. Thus, the circuit shown in U.S. Pat. No. 3,939,431 uses timers which have a predetermined time period. If the data signals have a different time period or frequency, the timers will not respond and hence the muting circuits will not function.

Accordingly, another object of my invention is to provide a new and improved muting circuit which can respond to or function with data signals whose frequency need not be predetermined, but may be any relatively constant frequency.

SUMMARY OF THE INVENTION

Briefly, these and other objects are achieved in accordance with my invention by a circuit primarily intended to be used with a radio receiver that demodulates or detects data signals. A circuit for indicating transitions in the state of the data signals is provided, and a synchronizing circuit produces window signals at the frequency of the incoming data. Logic means are coupled to the transition indicator and synchronizing circuit for producing a count signal in response to each occurrence of an indicated transition during a window signal, and for producing a reset signal in response to each occurrence of an indicated transition outside a window signal. Means coupled to the logic means count in one direction in response to each count signal, and are reset to zero in response to each reset signal. Means are coupled to the counting means for providing a desired function, such as audibly muting a radio receiver in response to a predetermined count, and for audibly unmuting the radio receiver in response to a count less than the predetermined count. Thus, data signals will not be audibly reproduced by the receiver, but voice or other random signals will be reproduced.

BRIEF DESCRIPTION OF THE DRAWING

The subject matter which I regard as my invention is particularly pointed out and distinctly claimed in the claims. The structure and operation of my invention, together with further objects and advantages, may be better understood from the following description given in connection with the accompanying drawing, in which:

DESCRIPTION OF THE PREFERRED EMBODIMENT

Figure 1:
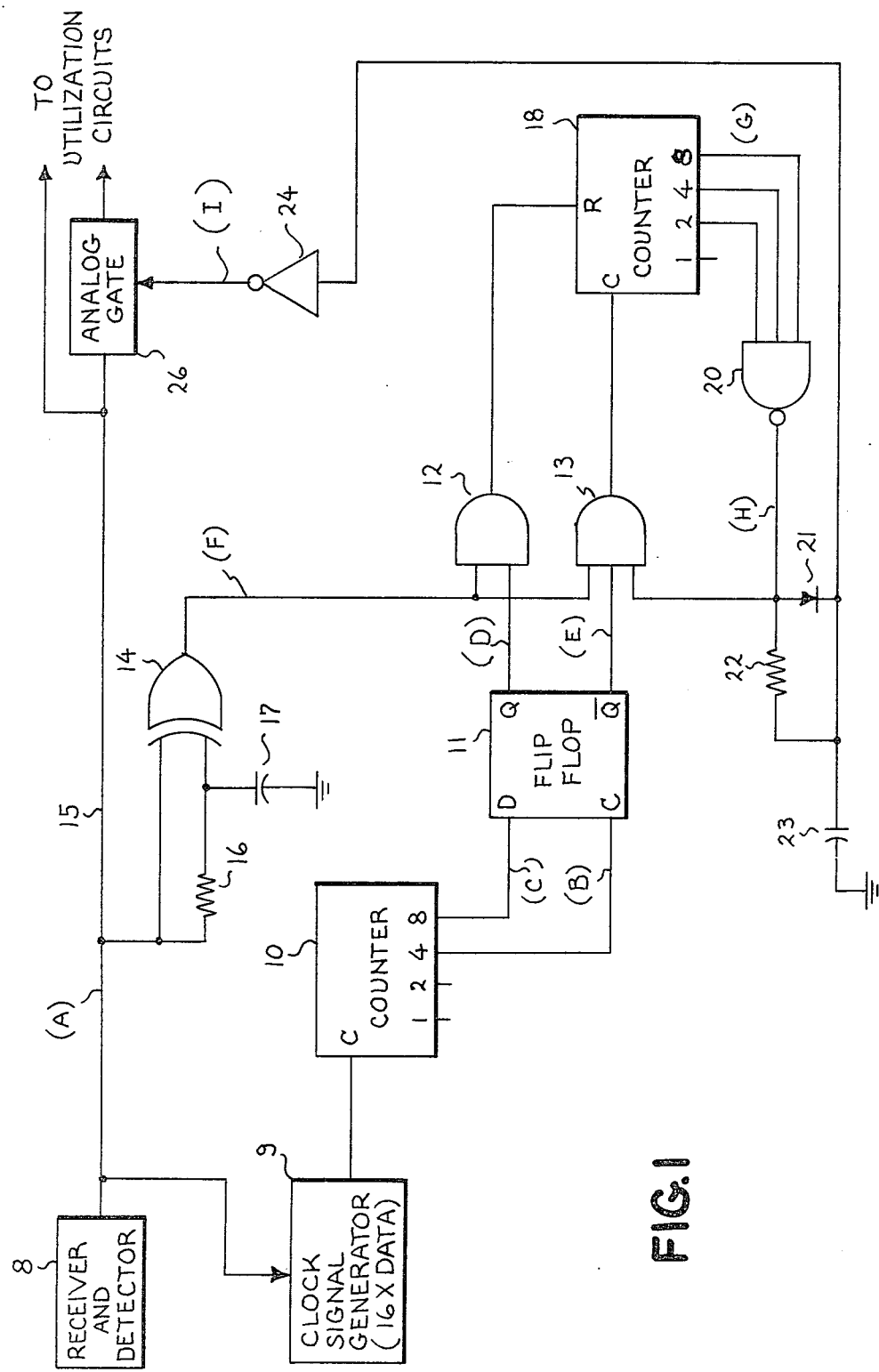
FIG. 1 shows a schematic block diagram of a preferred embodiment of a muting circuit in accordance with my invention.

As shown in FIG. 1, my improved muting circuit is primarily intended to be used with a radio communication receiver 8. However, my muting circuit can be used in other applications where it is necessary to distinguish between relatively random signals, such as voice signals, and relatively uniform signals, such as a data signal having a selected frequency or rate. If my muting circuit is to be used in the radio receiver 8, the receiver 8 can include a detector (indicated) for demodulating the signals from whatever type of modulation is used. The signals produced by the detector 8 are applied to an output bus 15. These signals can be utilized without modification or control, or after being passed by an analog or audio gate 26, can be utilized. The data signals could provide identification, control, or some other function in a receiver. The voice signals would usually be applied to a loudspeaker or other reproducing device. However, since the data signals usually precede the voice signals in a transmission, the loudspeaker or reproducing device will reproduce these data signals (which usually sound like chirps or buzzes). This creates an annoying sound or background to an operator or user before the voice signals appear. It is therefore desirable that the receiver be muted (or the loudspeaker cut off) when data signals are received, but that the receiver be unmuted for voice signals. My circuit provides an improved arrangement for achieving this.

In this circuit I have assumed that a logic 1 is indicated by a high signal, and a logic 0 is indicated by a low signal. The data signals will, for a given application, have a relatively constant rate or frequency. These signals are applied to a clock signal generator 9 which produces clock signals (that are relatively square and uniform) from the data signals in any one of several known arrangements. For example, the data signals can be applied to a phase locked loop having a relatively stable oscillator which can be controlled by the data signals to produce the clock signals, preferably at a rate higher than the rate of the data signals. As indicated, a preferred rate is 16 times the data rate. The clock signals are applied to the clock input C of a counter 10. The counter 10 produces signals at its 1, 2, 4, and 8 outputs. I utilize the 4 and 8 outputs, which produce clock signals at one-fourth and one-eighth the clock signal rate, which, for a 16 times clock rate, is four times and two times the data rate respectively. The 8 output is applied to the D input of a D type flip-flop 11. The flip-flop 11 provides a window at its Q output which preferably occupies fifty percent of the width of a data signal. This window has the same frequency as the data signal, and is centered with respect to the correct timing of a data signal. However, persons skilled in the art will appreciate that the window may be narrowed or widened, and may be shifted relative to the data signal. The 4 output is applied to the clock input C of the flip-flop 11. The Q output of the flip-flop 11 is applied to one input of a two-input AND gate 12, and the Q output is applied to one input of a three-input AND gate 13. One input of each of the gates 12, 13 is coupled to the output of an EXCLUSIVE OR gate 14. And one input of the AND gate 13 is coupled to the output of a three-input NAND gate 20. One input of the EXCLUSIVE OR gate 14 is coupled directly to the detected signal bus 15, and the other input of the EXCLUSIVE OR gate 14 is coupled through a resistor 16 to the bus 15. This other input also has a capacitor 17 coupled between it and a point of reference potential or ground. The resistor 16 and the capacitor 17 form a holding or delay circuit which, in association with the EXCLUSIVE OR gate 14, causes the gate 14 to detect transitions in the detected signals.

The output of the AND gate 13 is applied to the clock input C of a counter 18, and the output of the AND gate 12 is applied to the reset input R of the counter 18. The counter 18 has 1, 2, 4 and 8 outputs, with the 2, 4 and 8 outputs being respectively coupled to the three inputs of the NAND gate 20. The output of the NAND gate 20 is applied to the AND gate 13 so that when a selected count (2 plus 4 plus 8 or 14) is reached, the AND gate 13 is blocked and the counting circuit is latched so that the counter 18 does not continue to count and eventually reach its capacity and become reset to zero. The output of the NAND gate 20 is also coupled to a rectifier 21, a resistor 22, and a capacitor 23 which provide a short holding circuit for the high or logic 1 output of the NAND gate 20. This logic 1 is also applied through the rectifier 21 to an inverter 24 which produces muting or unmuting signals for the radio receiver or other device utilized. The inverter signal is applied to the control input of the gate 26. When a mute (logic 1) signal is applied to the gate 26, the gate 26 blocks signals. When an unmute (logic 0) signal is applied to the gate 26, the gate 26 passes the signals. Normally, the data signals would be derived for utilization ahead of the gate 26 so they would not be blocked under mute conditions.

Figure 2:
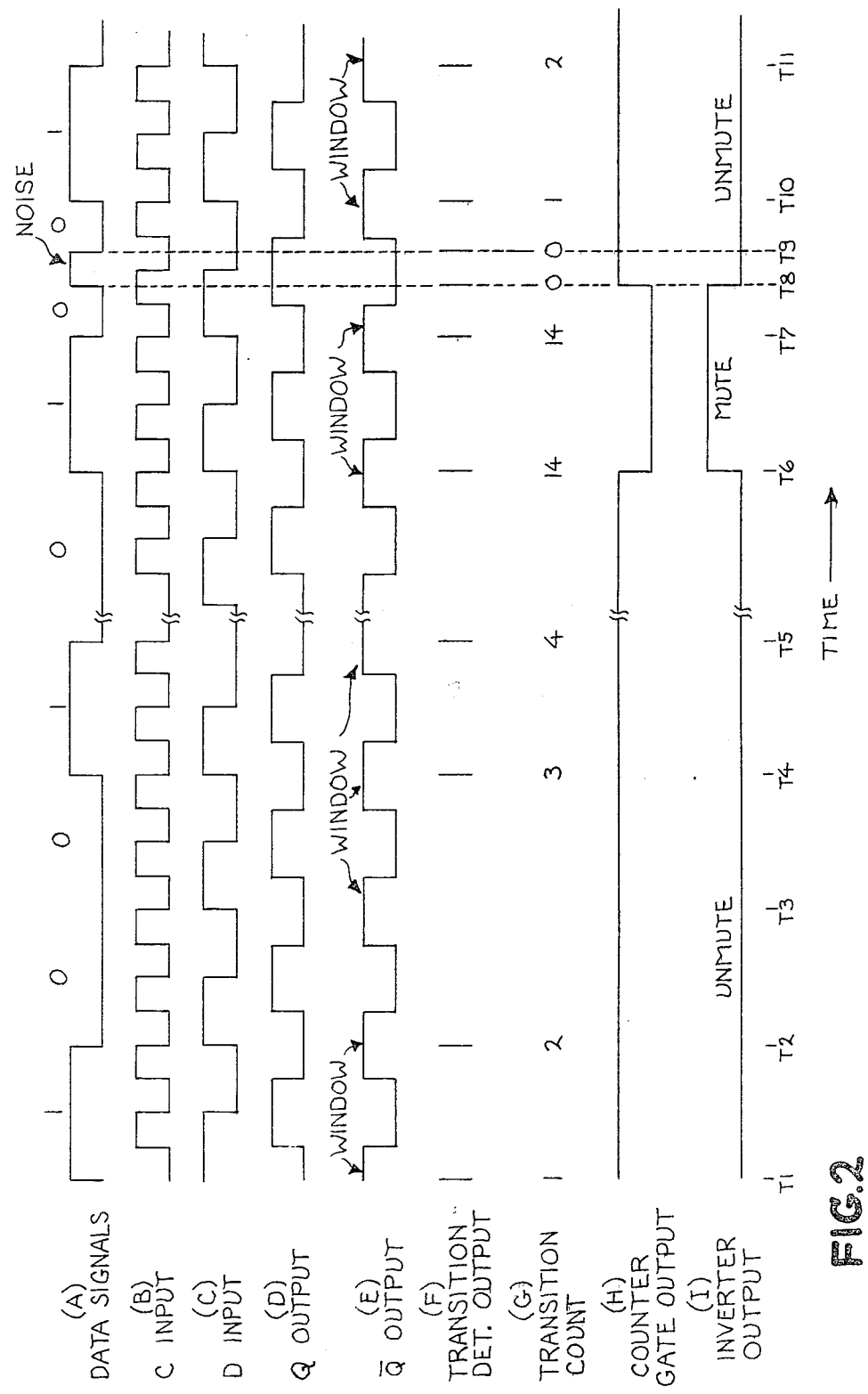
FIG. 2 shows wave forms for illustrating the operation of my muting circuit of FIG. 1.

The operation of the circuit of FIG. 1 will be explained in connection with the wave forms of FIG. 2 plotted along a common time axis. In FIG. 2, wave forms A through I are shown. These wave forms appear at corresponding locations A through I shown in FIG. 1. Wave form A shows the detected signals on the bus 15. Wave form B shows the 4 output from the counter 10 which is applied to the clock input C of the flip-flop 11. As mentioned, this wave form B has a rate or frequency that is one-fourth the clock rate, which in the embodiment shown, is four times the data rate. Wave form C shows the 8 output of the counter 10 which is applied to the D input of the flip-flop 11. This wave form C has a rate that is one-half the clock signal rate or twice the data rate. The flip-flop 11 is triggered by the rising edge of the clock input waveform B to produce the Q output shown in wave form D. Correspondingly, the Q̄ output of wave form E is the logic inversion of the wave form D. The Q̄ output provides the window signal. In FIG. 2, it will be noted that this window signal has a width that is one-half the width of a single data bit, and is centered on or around each data transition location or where such a transition would occur if the logic state changed.

The transition detector, provided by the EXCLUSIVE OR gate 14, the resistor 16, and the capacitor 17, has an output shown in wave form F. In wave form F, it will be noted that a pulse or output is provided for each leading edge and each trailing edge or transition of a data signal.

At the time T1, I have assumed that a sequence of data signals is supplied on the bus 15. Assuming that the clock signals have been appropriately generated, a window signal is produced by the Q̄ output shown in wave form E. Also, a transition signal is produced as shown in wave form F. On the assumption that the counter 18 has a count of less than 14 (or any other desired count), a logic 1 is produced by the NAND gate 20. The logic 1 produced by the NAND gate 20 enables the AND gate 13, and is inverted by the inverter 24 to an unmute signal. Thus, at the time T1, all inputs to the AND gate 13 are at a logic 1, so that a count signal is applied to the C counter input of the counter 18. Thus, a transition count of 1 is stored.

At the time T2, another transition takes place, and a second transition count is provided. No transition takes place at the time T3, since a second logic zero is produced. At the time T4, a transition occurs, and a third transition count is provided. Similarly, a fourth count is produced at the time T5.

After the time T5, I have assumed that a number of transitions take place, and that these are all counted. During this time interval, the gate 26 passes the data signals, and these might be heard, but for a very short time only. At the time T6, I assume the fourteenth consecutive transition occurs, so that the counter 18 supplies all logic 1's to the NAND gate 20. This causes the NAND gate 20 to produce a logic 0 which then blocks the AND gate 13, so that no further count signals are received. This logic 0 is inverted by the inverter 24 to a logic 1, which blocks the gate 26 and mutes the radio receiver or performs any other desired function. Thus, after a predetermined number of transitions occur during the window signals, the receiver is muted so that the operator does not have to listen to any further data signals.

At the time T7, I have assumed that a logic 0 begins in the data. Shortly after the beginning of this data signal of logic 0, I have assumed that a noise burst is received at the time T8 to make it appear that a transition occurs. However, this transition occurs outside of the window signal provided by the Q̄ output, namely while the Q output is at logic 1. This logic 1 and the transition cause the AND gate 12 to produce a logic 1 and reset the counter 18. Thus, the transition count is reset to 0, and the counter gate output 20 becomes a logic 1 again. This is inverted to a logic 0 to permit the gate 26 to pass signals. Thus, the radio receiver is unmuted. At the time T9, the noise burst in the data signal ends, so that another transition occurs when the Q output is at a logic 1. This keeps the transition count at 0.

At the time T10, another proper data transition occurs during a window, so that a transition count of 1 is provided. At the time T11, still another transition occurs during a window, so that a second transition count occurs. After 14 transition counts are counted, the receiver will again be muted.

After the data ends, random or voice signals usually begin. These random signals make it difficult to generate clock signals, and usually produce transitions which occur outside whatever window (Q̄) signals are produced. Hence, reset signals will be frequently generated by the AND gate 12 so that the counter 14 has a very slight chance of reaching a count of 14. As a result, the NAND gate 20 produces a logic 1 which is inverted to a logic 0 to unmute the receiver.

In summary, my circuit looks for data transitions that fall within a specified window. The circuit looks for N (such as 14 explained above) transitions consecutively that fall within the window, where the window width and the number of transitions define the amount of time it takes the data mute circuit to respond to the data format, and defines the amount of rejection to falsely triggering on voice. Any transitions that fall outside the window during the N transitions or subsequently during data will immediately unmute the receiver. Thus, even if the circuit mutes on voice, it will immediately unmute due to the random nature of threshold crossings from voice, and the result is that interruptions to voice will not be noticeable, or at most barely noticeable. The width of the window should be made wide enough to accommodate reasonable jitter due to noise (for signals near receiver threshold), but narrow enough so that random data crossings due to voice or noise will fall outside the window. A practical upper limit for window width is 50%.

It will thus be seen that I have provided a new and improved muting circuit that responds to data signals having almost any relatively uniform rate. This is achieved by the use of a clock generator which produces clock signals from and at an average of the data rate signals, and does not depend on fixed time circuits, such as one shot multivibrators. Thus, if the incoming data signals have a frequency that remains steady (at any value) long enough for the selected count to be reached, a muting signal will be produced. However, since my circuit does respond to a relatively uniform rate of signals, noise signals or voice signals which are random or non-uniform will not cause a muting signal to be produced. The relative uniformity must meet or must occur for a selected number of data transitions, in the example shown this being 14. However, persons skilled in the art will appreciate that any desired number of transitions can be set as the standard for muting a receiver. Thus, if a more rapid muting response is desired, then a fewer number of transitions may be employed. However, the faster response time must be traded off against a higher false mute detection rate. Conversely, it might be desirable to provide a muting signal with a lower probability of falsing only after as many as 20 or 30 transitions. These ranges are a matter of choice and design for a person of ordinary skill in the art. Furthermore, it is possible to count only the rising transitions or the falling transitions. This may be desirable where a simpler circuit implementation is desired, although it will lengthen the time required to determine whether the signal contains data or noise for a given probability of false mute detection. It is possible to use other types of logic circuits and arrangements to produce the window signals, to detect the transitions, and to count the number of transitions. Other types of clock generators which are governed or controlled by the data signals can be used. Therefore, while my invention has been described with reference to a particular embodiment, it is to be understood that modifications may be made without departing from the spirit of the invention or from the scope of the claims.

What I claim as new and desire to secure by Letters Patent of the United States is:

1. A circuit for detecting the presence of data or signals having a relatively constant frequency for a predetermined time comprising:
   a. a detector for indicating transitions in the state of said data or signals;
   b. a synchronizing circuit for producing window signals at said frequency;
   c. logic means coupled to said detector and to said synchronizing circuit for producing a count signal in response to each occurrence of an indicated transition during a window signal and for producing a reset signal in response to each occurrence of an indicated transition outside a window signal;
   d. and counting means coupled to said logic means for counting in one direction in response to each count signal and for resetting said counting means in response to each reset signal.

2. The circuit of claim 1 and further comprising utilization means coupled to said counting means and responsive to a predetermined count therein.

3. The circuit of claim 1 or claim 2 wherein said detector indicates transitions in both directions.

4. The circuit of claim 1 or claim 2 wherein said detector indicates transitions in only one direction.

5. A circuit for detecting the presence of data or signals having a frequency that is relatively constant for a selected time comprising:
   a. a detector responsive to said data or signals for indicating selected transitions between each state of said data or signals;
   b. a synchronizing circuit responsive to said data or signals for producing window signals of selected duration at said frequency;
   c. logic means coupled to said detector and to said synchronizing circuit for producing a count signal in response to each occurrence of an indicated transition during a window signal and for producing a reset signal in response to each occurrence of an indicated transition outside a window signal;
   d. counting means coupled to said logic means for counting in one direction in response to each count signal and for resetting said counting means in response to each reset signal;
   e. and utilization means coupled to said counting means and responsive to a predetermined count therein.

6. The circuit of claim 5 wherein said detector indicates transitions in both directions.

7. The circuit of claim 5 wherein said detector indicates transitions in only one direction.

8. A circuit for producing a muting signal and an unmuting signal for a radio receiver having a demodulator for providing first signals in response to received signals and having utilization means for said first signals, said circuit comprising:
   a. first means coupled to said demodulator for detecting transitions of said first signals;
   b. second means coupled to said first means for producing gating signals having a repetition rate determined by the frequency of said first signals;
   c. third means having a signal input coupled to said first means, having a control input coupled to said second means, and having an output, said third means producing a count signal at said output in response to selected transitions of said first signals occurring during a gating signal and for producing a reset signal at said output in response to selected transitions of said first signals outside a gating signal;

d. and fourth means coupled to said third means for producing an enabling signal for said utilization means in response to a predetermined number of said count signals without an intervening reset signal.

9. The circuit of claim 8 wherein said first means detect all transitions of said first signals.

10. The circuit of claim 8 wherein said first means detect transitions of said first signals in one direction.

11. The circuit of claim 8 or claim 9 or claim 10 and further comprising fifth means coupled between said fourth means and a control input of said third means for preventing said third means from producing count signals in response to said predetermined number of count signals.

* * * * *

UNITED STATES PATENT OFFICE
CERTIFICATE OF CORRECTION

Patent No. 4,344,175          Dated August 10, 1982

Inventor(s) Samuel A. Leslie

It is certified that error appears in the above-identified patent and that said Letters Patent are hereby corrected as shown below:

Column 2, line 65, cancel "Q" and insert -- $\overline{Q}$ --

Column 3, line 6, cancel "Q" and insert -- $\overline{Q}$ --

Column 3, line 63, cancel "Q" and insert -- $\overline{Q}$ --

Signed and Sealed this

Fifth Day of October 1982

[SEAL]

Attest:

Attesting Officer

GERALD J. MOSSINGHOFF

Commissioner of Patents and Trademarks